US012615832B2

(12) United States Patent
Zhou et al.

(10) Patent No.: US 12,615,832 B2
(45) Date of Patent: Apr. 28, 2026

(54) SELF-ALIGNED BACKSIDE CONTACT STRUCTURE FOR SEMICONDUCTOR DEVICE POWER DELIVERY

(71) Applicant: International Business Machines Corporation, Armonk, NY (US)

(72) Inventors: Huimei Zhou, Albany, NY (US); Su Chen Fan, Cohoes, NY (US); Ruilong Xie, Niskayuna, NY (US); Kisik Choi, Watervliet, NY (US); Miaomiao Wang, Albany, NY (US); Daniel Charles Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 415 days.

(21) Appl. No.: 18/516,002

(22) Filed: Nov. 21, 2023

(65) Prior Publication Data

US 2025/0169145 A1 May 22, 2025

(51) Int. Cl.
*H01L 29/417* (2006.01)
*H10D 30/43* (2025.01)
*H10D 30/67* (2025.01)
*H10D 62/10* (2025.01)
*H10D 64/01* (2025.01)
*H10D 64/23* (2025.01)
(Continued)

(52) U.S. Cl.
CPC .......... *H10D 64/254* (2025.01); *H10D 30/43* (2025.01); *H10D 30/6735* (2025.01); *H10D 30/6757* (2025.01); *H10D 62/121* (2025.01);
*H10D 64/01* (2025.01); *H10D 84/85* (2025.01); *H10W 20/43* (2026.01)

(58) Field of Classification Search
CPC .. H10D 64/254; H10D 30/43; H10D 30/6735; H10D 30/6757; H10D 62/121; H10D 64/01; H10D 84/85; H10D 30/014; H10D 62/151; H10D 84/0149; H10D 84/038; H10D 84/83; H10W 20/43; H10W 20/069; H10W 20/427
See application file for complete search history.

(56) References Cited

U.S. PATENT DOCUMENTS

| | | | |
|---|---|---|---|
| 9,966,371 B1 | 5/2018 | Tuominen | |
| 10,797,139 B2 | 10/2020 | Morrow | |

(Continued)

*Primary Examiner* — Mohammed R Alam
(74) *Attorney, Agent, or Firm* — David K. Mattheis

(57) ABSTRACT

A semiconductor structure includes a field effect transistor having a plurality of source/drain regions and a metal gate structure. A dielectric layer is in contact with a first surface of each of the plurality of source/drain regions, while a bottom dielectric isolation layer is in contact with a first surface of the metal gate structure. The bottom dielectric isolation layer is coplanar with the dielectric layer. The semiconductor structure further includes a backside metal contact that extends through a backside interlevel dielectric and the dielectric layer until an uppermost surface of at least one source/drain region of the plurality of source/drain regions. The backside interlevel dielectric is disposed above the dielectric layer and above the bottom dielectric isolation layer. The backside metal contact electrically connects the at least one source/drain region to a backside interconnect structure disposed above the backside interlevel dielectric.

16 Claims, 7 Drawing Sheets

100

(51) Int. Cl.
    *H10D 84/85*         (2025.01)
    *H10W 20/43*        (2026.01)

(56)             References Cited

U.S. PATENT DOCUMENTS

| 11,244,920 | B2 | 2/2022 | Uzoh | |
| 11,404,548 | B2 | 8/2022 | Yu | |
| 11,616,015 | B2 | 3/2023 | Morrow | |
| 2022/0093448 | A1 | 3/2022 | Yu | |
| 2022/0302268 | A1 | 9/2022 | Chiang | |
| 2023/0093101 | A1 | 3/2023 | Xie | |
| 2024/0274676 | A1* | 8/2024 | Lee | H10D 30/6729 |
| 2024/0429130 | A1* | 12/2024 | Kim | H10D 84/0149 |

* cited by examiner

100

100

SELF-ALIGNED BACKSIDE CONTACT STRUCTURE FOR SEMICONDUCTOR DEVICE POWER DELIVERY

BACKGROUND

The present invention generally relates to the field of semiconductor devices, and more particularly to power delivery to active devices.

Modern integrated circuits (IC) are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts. Power is provided to the integrated circuits through power rails, which are in the metal layers of integrated circuits. For example, the bottom metal layer ($M_0$ or $M_1$) may include a plurality of metal lines such as VDD power rails and VSS power rails.

As ICs continue to scale downward in size, backside power rails (BPRs), i.e., power rails that are formed in the backside of the wafer, usually under the transistor "fins", and backside power delivery ("backside" is below the transistor substrate) have been proposed to alleviate design challenges and enable technology scaling beyond the 5 nm technology node. The BPR technology can free up resources for dense logic connections that limit modern processor performance, enable further scaling of a standard logic cell by removing the overhead in the area occupied by the power rails, and allow thicker low-resistance power rails that enable lower voltage (IR) drops.

One way to implement BPR technology and facilitate semiconductor process integration includes the formation of backside metal contacts. In general, forming backside metal contacts can improve various aspects of semiconductor device configuration and performance, particularly with respect to density constraints. However, there also remain a number of non-trivial issues associated with the formation of backside metal contacts including backside metal fill issues (e.g., voids, Rc degradation, reliability problems, etc.) and backside overlay alignment.

SUMMARY

According to an embodiment of the present disclosure, a semiconductor structure includes a field effect transistor including a plurality of source/drain regions and a metal gate structure, a dielectric layer in contact with a first surface of each of the plurality of source/drain regions, a bottom dielectric isolation layer in contact with a first surface of the metal gate structure, the bottom dielectric isolation layer is coplanar with the dielectric layer, and a backside metal contact extending through a backside interlevel dielectric and the dielectric layer to an uppermost surface of at least one source/drain region of the plurality of source/drain regions, the backside interlevel dielectric is disposed above the dielectric layer and above the bottom dielectric isolation layer, the backside metal contact electrically connects the at least one source/drain region to a backside interconnect structure disposed above the backside interlevel dielectric. In an embodiment, the bottom dielectric isolation layer and the dielectric layer form an etch stop layer. In an embodiment, the dielectric layer includes a source/drain isolation region of rectangular shape. In an embodiment, the dielectric layer includes a first dielectric material and the bottom dielectric isolation layer includes a second dielectric material, where an etch rate of the first dielectric material is different from an etch rate of the second dielectric material. In an embodiment, the first dielectric material has high etch selectivity with respect to the second dielectric material.

According to another embodiment of the present disclosure, a method of forming a semiconductor structure includes forming a field effect transistor including a plurality of source/drain regions and a metal gate structure, forming a dielectric layer in contact with a first surface of each of the plurality of source/drain regions, forming a bottom dielectric isolation layer in contact with a first surface of the metal gate structure, the bottom dielectric isolation layer is coplanar with the dielectric layer, and forming a backside metal contact, the backside metal contact extending through a backside interlevel dielectric and the dielectric layer until an uppermost surface of at least one source/drain region of the plurality of source/drain regions, the backside interlevel dielectric is disposed above the dielectric layer and above the bottom dielectric isolation layer, where the backside metal contact electrically connects the at least one source/drain region to a backside interconnect structure disposed above the backside interlevel dielectric. In an embodiment, the bottom dielectric isolation layer and the dielectric layer form an etch stop layer. In an embodiment, the dielectric layer comprises a source/drain isolation region of rectangular shape. In an embodiment, the dielectric layer includes a first dielectric material and the bottom dielectric isolation layer includes a second dielectric material, where an etch rate of the first dielectric material is different from an etch rate of the second dielectric material. In an embodiment, the first dielectric material has high etch selectivity with respect to the second dielectric material.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
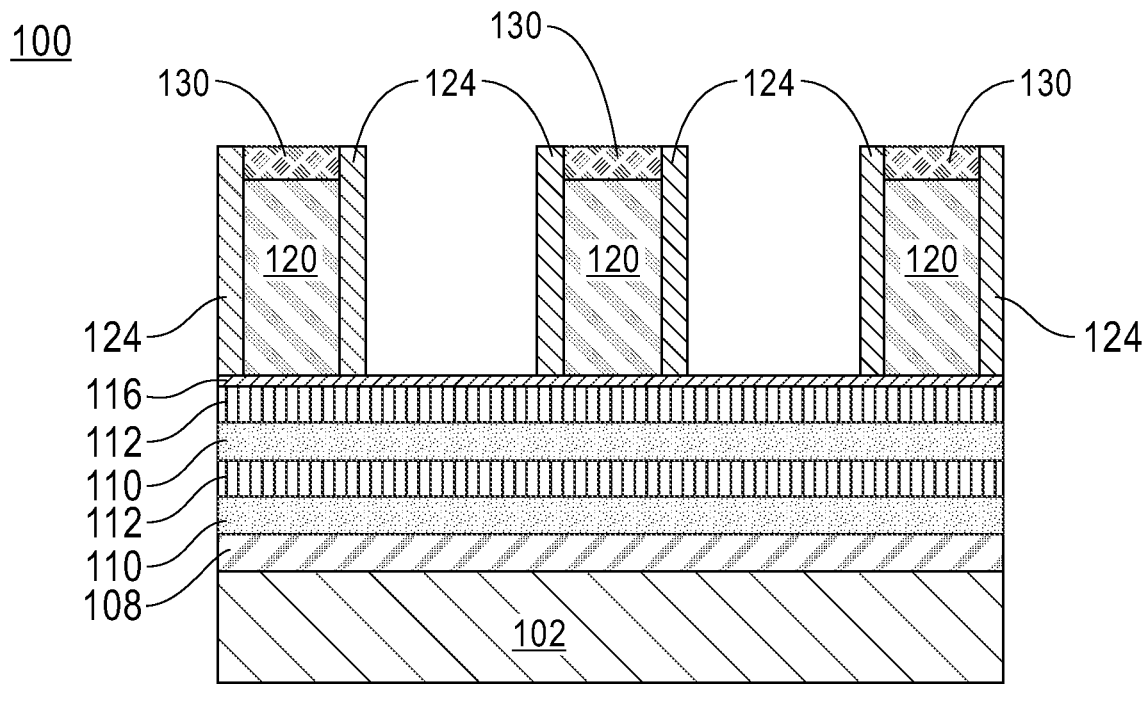
FIG. 1 is a cross-sectional view of a semiconductor structure at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

Embodiments of the present disclosure provide a semiconductor structure, and a method of making the same, in which improved self-aligned backside metal contacts are formed for connecting to power rails located on a backside of the wafer. The backside metal contacts and backside power rails are formed by backside processes which are performed after completing BEOL processes and flipping the wafer over. Specifically, in the proposed embodiments, a layer of dielectric material having different etch selectivity than a bottom isolation region is formed under source/drain regions of the semiconductor structure, while the bottom isolation region remains under the gate structure. In the proposed embodiments, the bottom isolation region and the layer of dielectric material are substantially coplanar forming an etch stop layer that protects the semiconductor structure during backside substrate removal process. Additionally, the layer of dielectric material formed below the source/drain regions can be selectively etched with respect to the bottom isolation region during backside metal contact formation. This allows forming self-aligned contact structures with controlled overlay shift and increased contact area that can improve Vmax and reduce contact resistance (Rc).

An embodiment by which the semiconductor structure with improved self-aligned backside metal contact can be formed is described in detailed below by referring to the accompanying drawings in FIGS. 1-13.

Referring now to FIG. 1, a cross-sectional view of a semiconductor structure 100 is shown at an intermediate step during a semiconductor manufacturing process, according to an embodiment of the present disclosure.

Known semiconductor fabrication operations have been used to form the semiconductor structure 100 as depicted in FIG. 1. Thus, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In the depicted embodiment, the semiconductor structure 100 includes a substrate 102. The substrate 102 may be, for example, a bulk substrate, which may be made from any of several known semiconductor materials such as, for example, silicon, germanium, silicon-germanium alloy, and compound (e.g., III-V and II-VI) semiconductor materials. Non-limiting examples of compound semiconductor materials include gallium arsenide, indium arsenide, and indium phosphide, or indium gallium phosphide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

According to an embodiment, the semiconductor structure 100 further includes a nanosheet stack consisting of an alternating sequence of layers of sacrificial semiconductor material and layers of semiconductor channel material that are vertically stacked one on top of another in a direction perpendicular to the substrate 102, as illustrated in the figure. Specifically, the alternating sequence includes a nanosheet stack sacrificial layer 108 formed above the substrate 102, a sacrificial semiconductor layer 110 formed above the nanosheet stack sacrificial layer 108, and a semiconductor channel layer 112 formed above the sacrificial semiconductor layer 110. In the example depicted in the figure, alternating sacrificial semiconductor layers 110 and semiconductor channel layers 112 are vertically stacked above the nanosheet stack sacrificial layer 108. The term sacrificial, as used herein, means a layer or other structure, that is (or a part thereof is) removed before completion of the final device.

For instance, in the example being described, portions of the sacrificial semiconductor layers 110 will be removed from the stack of layers of sacrificial semiconductor material and layers of semiconductor channel material in the channel region of the device to permit the semiconductor channel layers 112 to be released from the nanosheet stack. It is notable that while in the present example the sacrificial semiconductor layers 110 and the semiconductor channel layers 112 are made of silicon germanium (SiGe) and silicon (Si), respectively, any combination of sacrificial and channel materials may be employed in accordance with the present techniques. For example, one might instead employ selective etching technology which permits Si to be used as the sacrificial material between SiGe channel layers.

With continued reference to FIG. 1, in one or more embodiments, the first sacrificial layer in the stack, i.e., the nanosheet stack sacrificial layer 108, is formed off a surface of the substrate 102 using an epitaxial growth process. For instance, in the described embodiment, the nanosheet stack sacrificial layer 108 is formed by epitaxially growing a layer of SiGe with a germanium concentration preferably higher than 30 atomic percent. In a preferred embodiment, the nanosheet stack sacrificial layer 108 includes a layer of SiGe with a germanium concentration of approximately 55 atomic percent. The higher concentration of germanium atoms allows the nanosheet stack sacrificial layer 108 to be removed selectively to the remaining alternating layers of the nanosheet stack, as will be described in detail below. By way of example only, the nanosheet stack sacrificial layer 108 may be formed having a thickness varying from approximately 5 nm to approximately 20 nm, although thicknesses greater than 20 nm and less than 5 nm may also be used.

In general, layers in the nanosheet stack (i.e., layers of (SiGe) sacrificial semiconductor material and layers of (Si) semiconductor channel material) can be formed by epitaxial growth by using the substrate 102 as the seed layer. For instance, the sacrificial semiconductor layers 110 are formed by epitaxially growing a layer of SiGe. In this embodiment, the germanium concentration of the sacrificial semiconductor layers 110 may vary from approximately 15 atomic percent to approximately 35 atomic percent. In a preferred embodiment, each of the sacrificial semiconductor layers 110 includes a layer of SiGe with a germanium concentration of approximately 30 atomic percent.

To continue building the nanosheet stack above the substrate 102, the semiconductor channel layers 112 are formed by epitaxially growing a Si layer. As depicted in the figure, the sacrificial semiconductor layers 110 and the semiconductor channel layers 112 have a substantially similar or identical thickness. The nanosheet stack can be grown by forming (SiGe) sacrificial semiconductor layers 110 and (Si) semiconductor channel layers 112 in an alternating manner onto the nanosheet stack sacrificial layer 108. Accordingly, each of the sacrificial semiconductor layers 110 and the semiconductor channel layers 112 in the nanosheet stack 10 can be formed in the same manner as described above, e.g., using an epitaxial growth process, to a thickness varying from approximately 3 nm to approximately 12 nm, although other thicknesses are within the contemplated scope of the invention.

Thus, each of the layers in the nanosheet stack have nanoscale dimensions, and thus can also be referred to as nanosheets. Further, as highlighted above, the (Si) semiconductor channel layers 112 in the nanosheet stack will be used to form the channel layers of the device. Consequently, the dimensions of the semiconductor channel layers 112 dictate the dimensions of the channel region of the semiconductor structure 100.

As highlighted above, the goal is to produce a stack of alternating (sacrificial and channel) SiGe and Si layers on the wafer. The number of layers in the stack can be tailored depending on the particular application. Thus, the configurations depicted and described herein are merely examples meant to illustrate the present techniques. For instance, the present nanosheet stack can contain more or fewer layers than are shown in the figures.

The nanosheet stack can be used to produce a gate all around device that includes vertically stacked semiconductor channel material nanosheets for a positive channel Field Effect Transistor (hereinafter "PFET") or a negative channel Field Effect Transistor (hereinafter "NFET") device.

In general, the nanosheet stack sacrificial layer 108, (SiGe) sacrificial semiconductor layers 110 and (Si) semiconductor channel layers 112 can be formed by epitaxial growth by using the substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the nanosheet stack sacrificial layer 108, (SiGe) sacrificial semiconductor layers 110 and (Si) semiconductor channel layers 112. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

With continued reference to FIG. 1, the semiconductor structure 100 further includes a first dielectric layer 116 for electrically separating subsequently formed structures from the stack of sacrificial semiconductor layers 110 and semiconductor channel layers 112. According to an embodiment, the first dielectric layer 116 can be formed by deposition of any suitable dielectric material. Non-limiting examples of suitable dielectric materials for forming the first dielectric layer 116 may include silicon oxide, silicon nitride, hydrogenated silicon carbon oxide, silicon based low-k dielectrics, and the like. The first dielectric layer 116 can be deposited using, for example, a chemical vapor deposition (CVD) process. In one or more embodiments, the first dielectric layer 116 may have a thickness varying from approximately 2 nm to approximately 10 nm, and ranges therebetween.

After forming the first dielectric layer 116, a dummy gate 120 and a sacrificial hardmask 130 can be formed in the semiconductor structure 100, according to an embodiment of the present disclosure. The dummy gate 120 and sacrificial hardmask 130 form a sacrificial gate structure for the semiconductor structure 100. The process of forming the dummy gate 120 and sacrificial hardmask 130 is typical and well-known in the art. In one or more embodiments, the dummy gate 120 can be formed from amorphous silicon (a-Si), and the sacrificial hardmask 130 can be formed from silicon nitride (SiN), silicon oxide, an oxide/nitride stack, or similar materials and configurations.

After depositing suitable materials for forming the dummy gate 120 and sacrificial hardmask 130, the dummy gate 120 and sacrificial hardmask 130 are patterned as depicted in the figures. As known by those skilled in the art, the process of patterning the dummy gate 120 typically involves exposing a pattern on a photoresist layer (not shown) and transferring the pattern to the sacrificial hardmask 130 and dummy gate 120 using known lithography and RIE processing.

According to an embodiment, sidewall spacers 124 can be formed along sidewalls of the dummy gate 120 and sacrificial hardmask 130, as depicted in FIG. 1. The sidewall spacers 124 can be formed by depositing a spacer material on the semiconductor structure 100. As depicted in FIG. 1, the spacer material deposits along sidewalls of the dummy gate 120 and sacrificial hardmask 130 to form the sidewall spacers 124. In one or more embodiments, the sidewall spacers 124 can be formed using a spacer pull down formation process. In other embodiments, the sidewall spacers 124 can be formed using a sidewall image transfer (SIT)

spacer formation process, which includes spacer material deposition followed by directional RIE of the deposited spacer material.

Non-limiting examples of various spacer materials for forming the sidewall spacers 124 may include conventional low-k materials such as SiN, SiON SiOCN, or SiBCN. Typically, a thickness of the sidewall spacers 124 may vary from approximately 5 nm to approximately 20 nm, and ranges therebetween.

Figure 2:
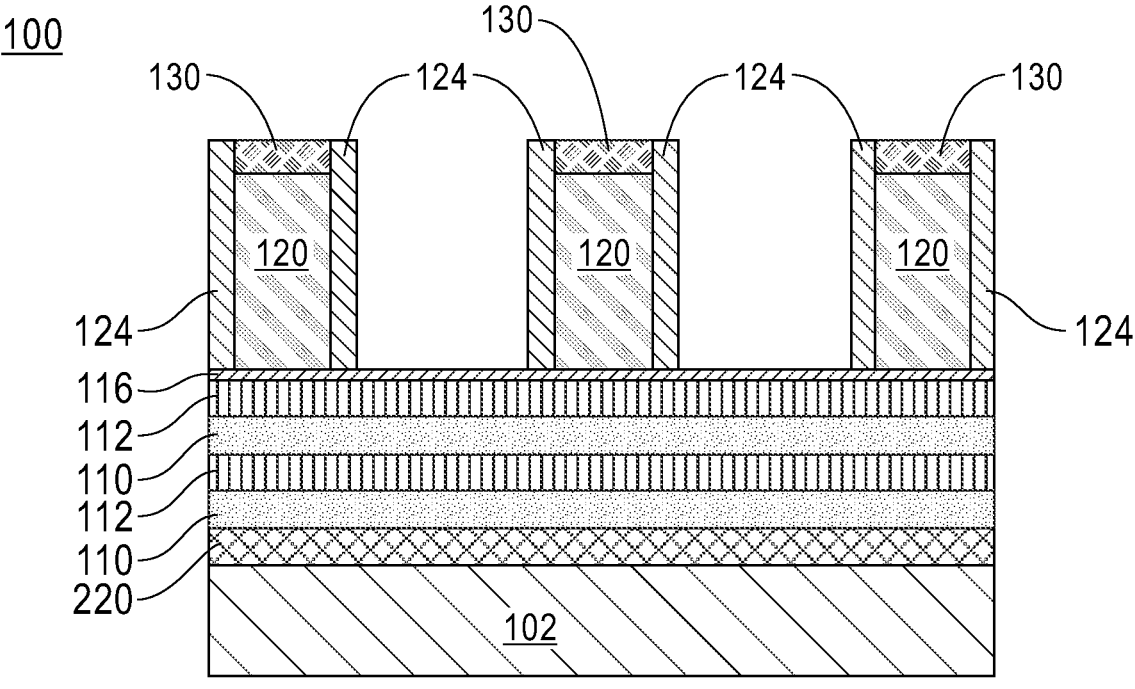
FIG. 2 is a cross-sectional view of the semiconductor structure after forming a bottom dielectric isolation layer, according to an embodiment of the present disclosure.

Referring now to FIG. 2, a cross-sectional view of the semiconductor structure 100 is shown after forming a bottom dielectric isolation layer 220, according to an embodiment of the present disclosure.

In the depicted embodiment, nanosheet stack sacrificial layer 108 (FIG. 1) is removed from the semiconductor structure 100. Removal of the nanosheet stack sacrificial layer 108 (FIG. 1) creates an opening (not shown) in areas of the semiconductor structure 100 from which the nanosheet stack sacrificial layer 108 (FIG. 1) was removed. According to an embodiment, the nanosheet stack sacrificial layer 108 is removed selective to the sacrificial semiconductor layers 110, the semiconductor channel layers 112, the dummy gate 120 and the sacrificial hardmask 130. For example, a highly selective dry etch process can be used to selectively remove the nanosheet stack sacrificial layer 108 (FIG. 1).

According to an embodiment, after removing the nanosheet stack sacrificial layer 108 (FIG. 1), a dielectric material is deposited in the semiconductor structure 100. The deposited dielectric material fills the openings (not shown) formed in the semiconductor structure 100 after removing the nanosheet stack sacrificial layer 108 (FIG. 1). The spacer material deposited within the remaining openings forms a bottom dielectric isolation layer 220 located between the substrate 102 and a bottommost sacrificial semiconductor layer 110. In some embodiments, the bottom dielectric isolation layer 220 and sidewall spacers 124 may be composed of different materials. In other embodiments, the bottom dielectric isolation layer 220 and sidewall spacers 124 may be composed of similar materials. In an exemplary embodiment, the bottom dielectric isolation layer 220 is formed by depositing a layer of silicon nitride (SiN) using known deposition processes.

Figure 3:
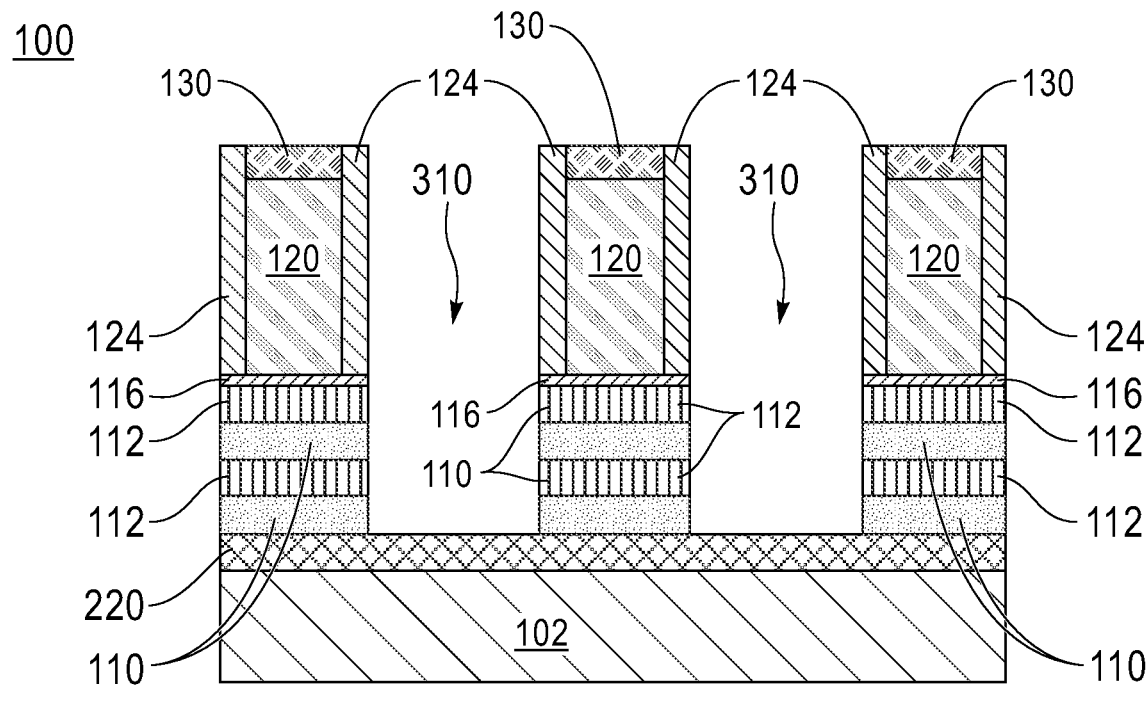
FIG. 3 is a cross-sectional view of the semiconductor structure after patterning a stack of sacrificial semiconductor layers and semiconductor channel layers, according to an embodiment of the present disclosure.

Referring now to FIG. 3, a cross-sectional view of the semiconductor structure 100 is shown after patterning the nanosheet stack of sacrificial semiconductor layers 110 and semiconductor channel layers 112, according to an embodiment of the present disclosure.

In the depicted embodiment, sidewall spacers 124 can be used as a mask, to recess portions of the stack of sacrificial semiconductor layers 110 and semiconductor channel layers 112 (i.e., nanosheet fins) not covered by the sidewall spacers 124 and dummy gate 120, as illustrated in FIG. 3. For example, a RIE process can be used to recess the portions of the stack of sacrificial semiconductor layers 110 and semiconductor channel layers 112 that are not under the sidewall spacers 124 and dummy gate 120. According to an embodiment, the stack of sacrificial semiconductor layers 110 and semiconductor channel layers 112 can be recessed until reaching a top portion of the bottom dielectric isolation layer 22. As depicted in FIG. 3, recessing the stack of sacrificial semiconductor layers 110 and semiconductor channel layers 112 form first openings (or source/drain recesses) 310 in the semiconductor structure 100. As may be understood, uncovered portions of the first dielectric layer 116 can also be removed during the RIE process.

Figure 4:
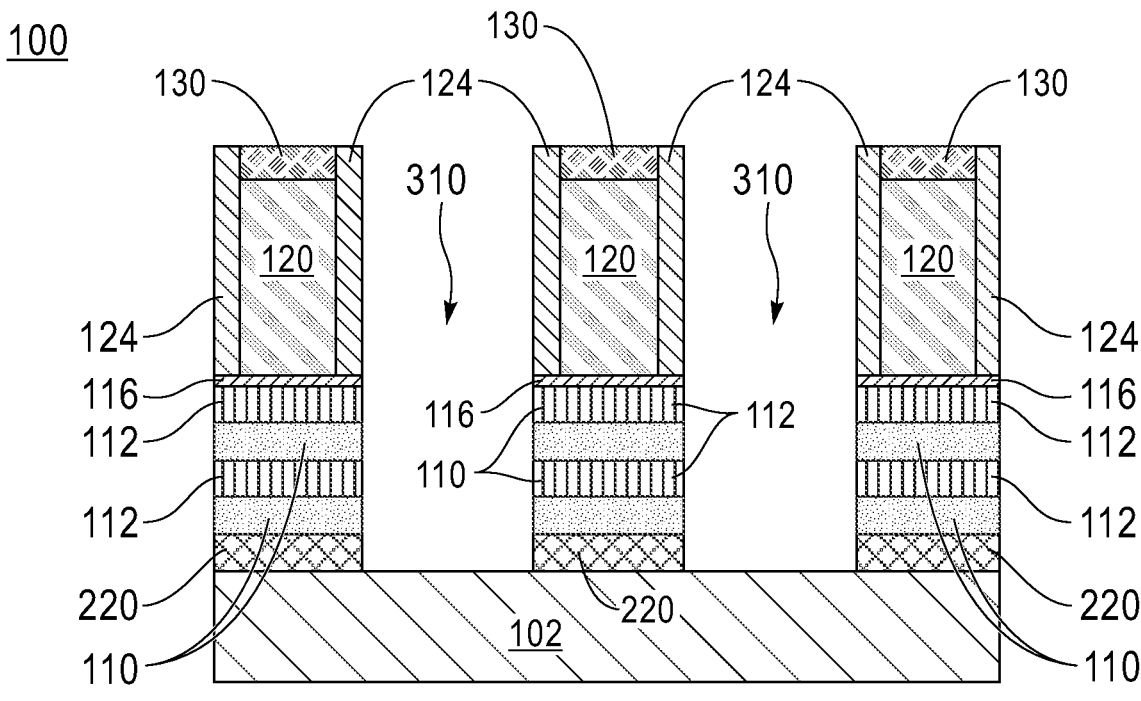
FIG. 4 is a cross-sectional view of the semiconductor structure after recessing the bottom dielectric isolation layer, according to an embodiment of the present disclosure.

Referring now to FIG. 4, a cross-sectional view of the semiconductor structure 100 is shown after recessing the bottom dielectric isolation layer 220, according to an embodiment of the present disclosure.

According to an embodiment, the semiconductor manufacturing process continues by conducting an etching process on the semiconductor structure 100 to selectively removed exposed portions (i.e., portions extending outwards from the stack of sacrificial semiconductor layers 110 and semiconductor channel layers 112) of the bottom dielectric isolation layer 220. In an exemplary embodiment, a RIE process can be used to remove such portions of the bottom dielectric isolation layer 220 and further extend the first openings 310. As depicted in the figure, removing uncovered portions of the bottom dielectric isolation layer 220 expose an uppermost surface of the substrate 102. Stated differently, the extended first openings 310 expose a top surface of the substrate 102.

Figure 5:
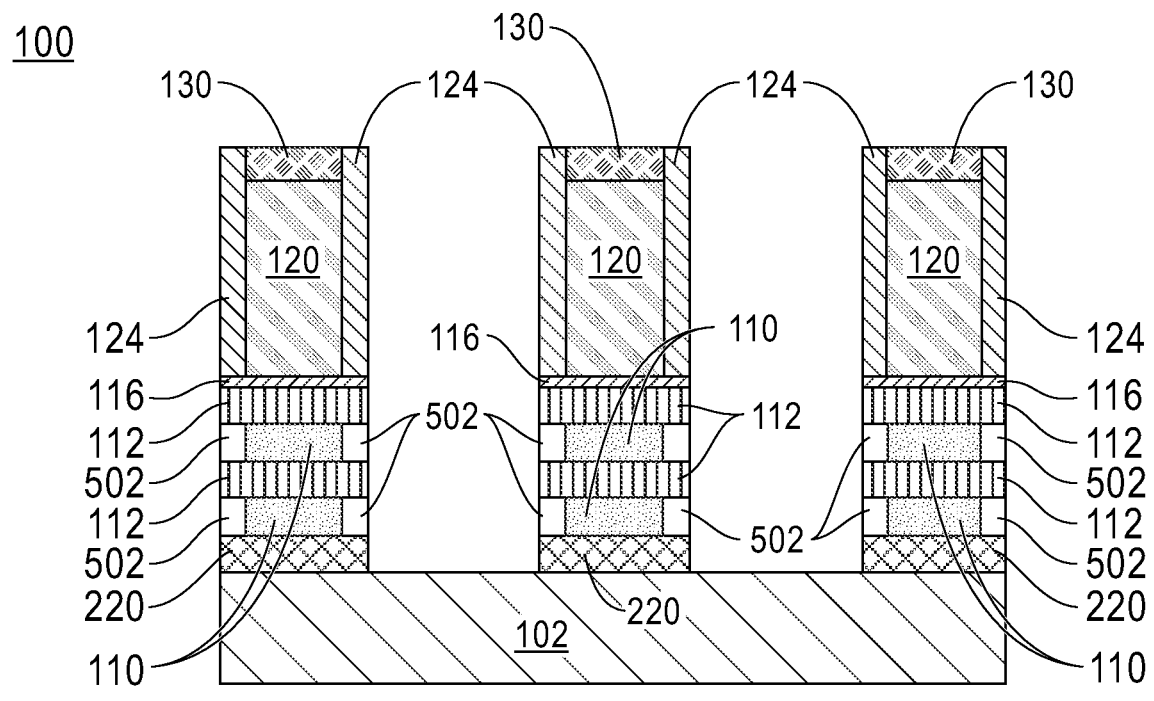
FIG. 5 is a cross-sectional view of the semiconductor structure after forming inner spacers, according to an embodiment of the present disclosure.

Referring now to FIG. 5, a cross-sectional view of the semiconductor structure 100 is shown after forming inner spacers 502, according to an embodiment of the present disclosure.

According to an embodiment, outer portions of each of the sacrificial semiconductor layers 110 are selectively recessed using, for example, a selective etch process such as a hydrogen chloride (HCL) gas etch. Preferably, the selected etch process for recessing the sacrificial semiconductor layers 110 is capable of etching silicon germanium without attacking silicon. The inner spacers 502 may be formed within an indented cavity (not shown) formed after etching the sacrificial semiconductor layers 110.

The inner spacers 502 can be formed, for example, by conformal deposition of an inner spacer dielectric material that pinches off the indented cavity (not shown) formed after recessing the sacrificial semiconductor layers 110. The inner spacers 502 may be formed using any suitable dielectric material, such as silicon dioxide, silicon nitride, SiOC, SiOCN, SiBCN, and may include a single layer or multiple layers of dielectric materials. An isotropic etch can then be conducted to remove excess inner spacer material from other regions of the semiconductor structure 100.

As depicted in FIG. 5, outer sidewalls of the inner spacers 502 are vertically aligned with the semiconductor channel layers 112, and thus with upper portions of the sidewall spacers 124 located on opposing sidewalls of the dummy gate 120.

Figure 6:
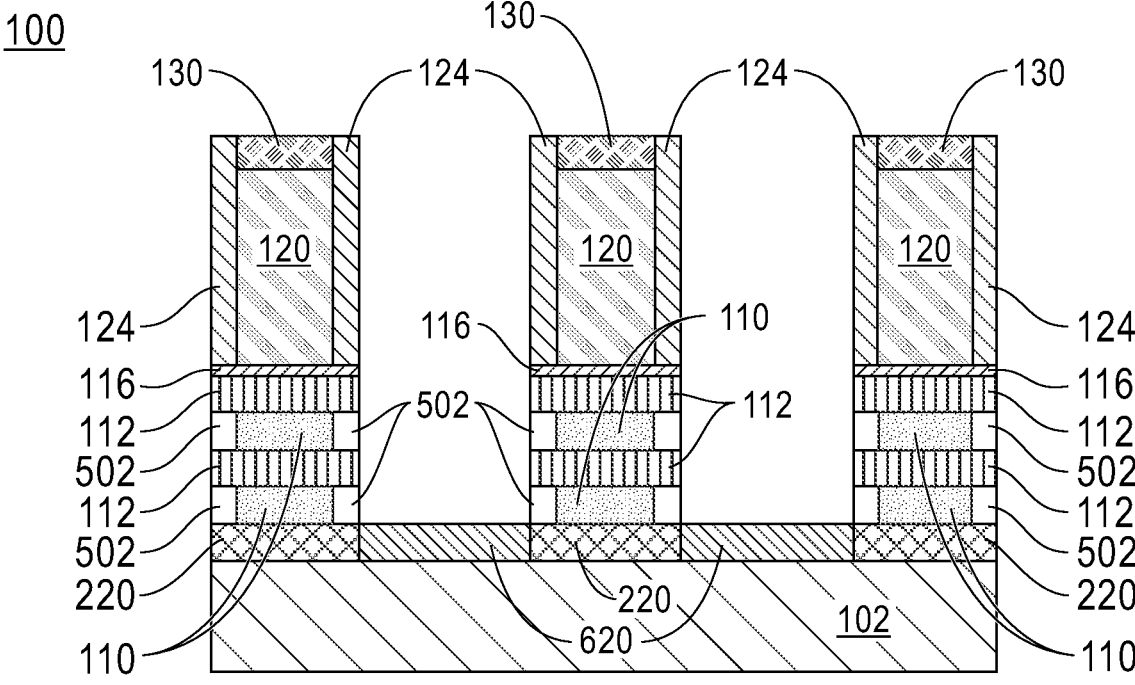
FIG. 6 is a cross-sectional view of the semiconductor structure after forming a second dielectric layer, according to an embodiment of the present disclosure.

Referring now to FIG. 6, a cross-sectional view of the semiconductor structure 100 is shown after forming a second dielectric layer 620, according to an embodiment of the present disclosure.

At this step of the manufacturing processing, known processing techniques have been conducted on the semiconductor structure 100 to form the second dielectric layer 620 above exposed surfaces of the substrate 102. In one or more embodiments, non-conformal deposition, and etch-back processing (e.g., physical vapor deposition (PVD), high density plasma (HDP) deposition, etc.) can be used to form the second dielectric layer 620. Non-limiting examples of materials for forming the second dielectric layer 620 may include $SiO_2$, SiN, silicon carbide oxide (SiCO), silicon boron carbide nitride (SiBCN) and/or other like materials. The second dielectric layer 620 may have a (vertical) thickness ranging from approximately 2 nm to approximately 10 nm, although other thicknesses above or below this range may be used as desired for a particular application. Preferably, the dielectric material forming the second dielectric layer 620 has high etch selectivity with respect to the dielectric material forming the bottom dielectric isolation layer 220. Stated differently, the second dielectric layer 620 etches faster than the bottom dielectric isolation layer 220. As may be understood, high etch selectivity is a relative term to describe when two materials etch at significantly different etch rates to provide desired results.

Accordingly, the second dielectric layer 620 provides a source/drain isolation region of rectangular shape for the semiconductor structure 100. Additionally, as depicted in the figure, a top surface of the bottom dielectric isolation layer 220 is substantially coplanar or flushed with a top surface of the second dielectric layer 620. This coplanar rectangular region formed by the bottom dielectric isolation layer 220 and the second dielectric layer 620 acts as an etch stop layer during subsequent etching processes, as will be described in detail below.

Figure 7:
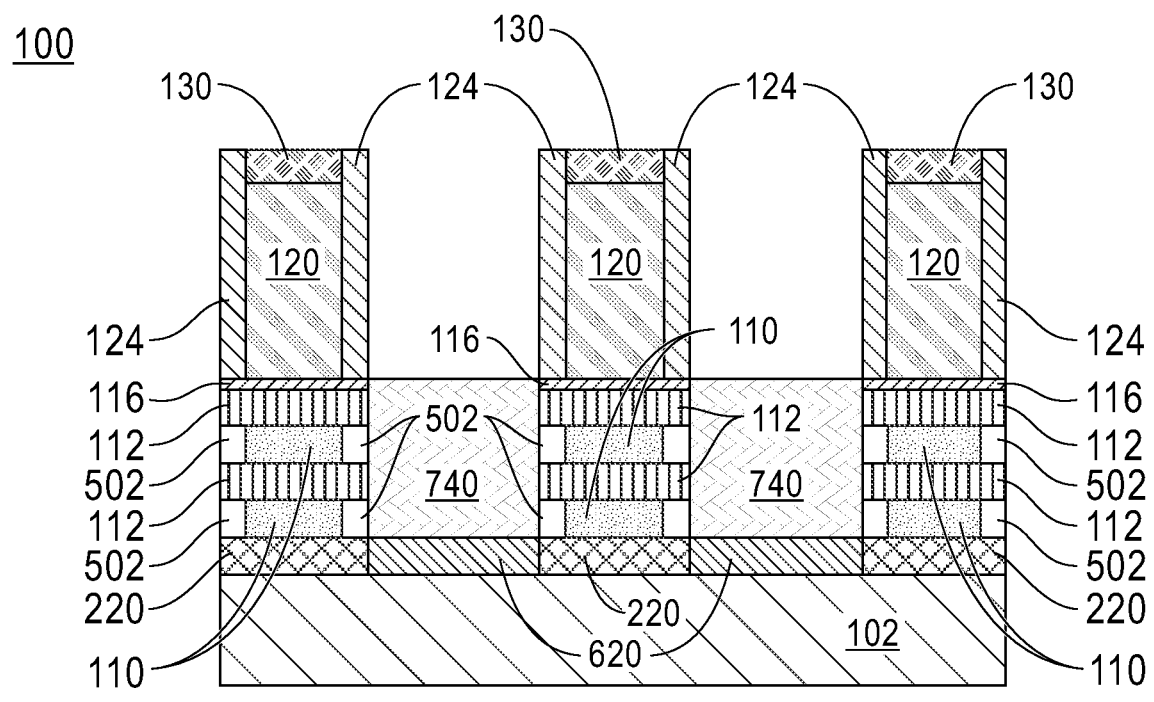
FIG. 7 is a cross-sectional view of the semiconductor structure after forming source/drain regions, according to embodiments of the present disclosure.
Figure 8:
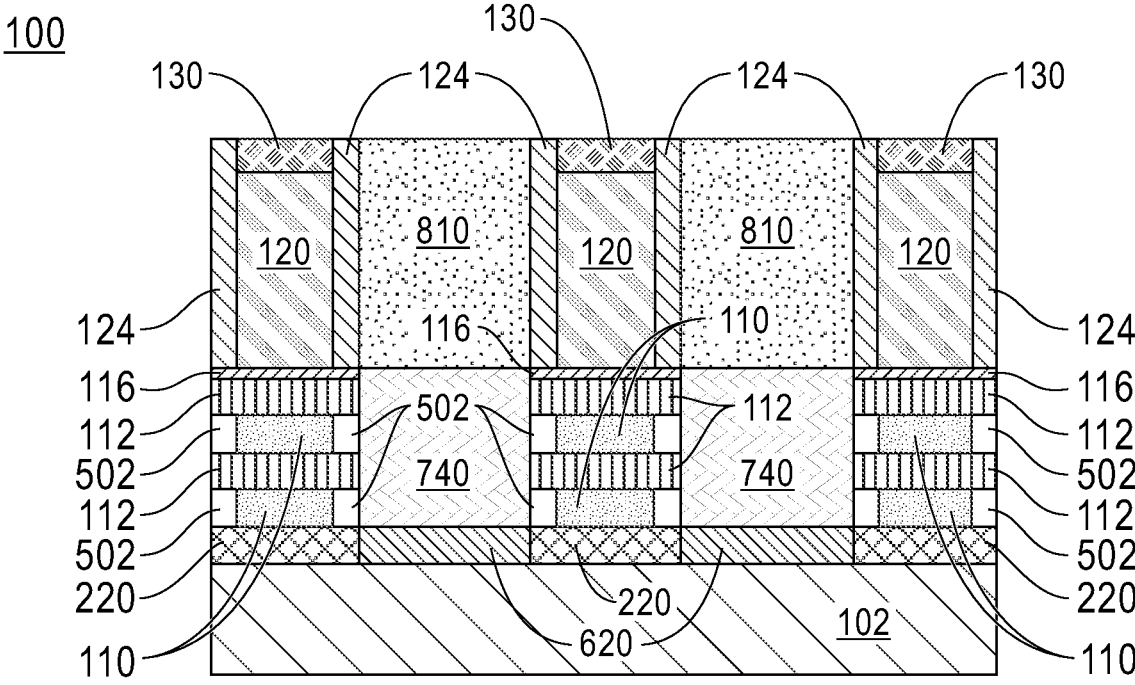
FIG. 8 is a cross-sectional view of the semiconductor structure after forming a first interlevel dielectric layer, according to embodiments of the present disclosure.

Referring now to FIG. 7 and FIG. 8, simultaneously, cross-sectional views of the semiconductor structure 100 are shown after forming source/drain regions 740 and forming a first interlevel dielectric layer 810, according to embodiments of the present disclosure.

At this step of the manufacturing process, source/drain regions 740 are formed in the semiconductor structure 100. As known by those skilled in the art, source/drain regions are formed within NFET and PFET regions (not shown) of the semiconductor structure 100 using methods well-known in the art. For example, the source/drain regions 740 can be formed using an epitaxial layer growth process on the exposed ends of the semiconductor channel layers 112. The source/drain regions 740 can be formed on opposing sides of, and in direct contact with, end portions of the semiconductor channel layers 112 and end portions of the inner spacers 502.

After forming the source/drain regions 740, a first interlevel dielectric layer 810 can be formed to fill voids in the semiconductor structure 100. The first interlevel dielectric layer 810 can be formed by, for example, CVD of a dielectric material. Non-limiting examples of dielectric materials to form the first interlevel dielectric layer 810 may include silicon oxide, silicon nitride, hydrogenated silicon carbon oxide, silicon based low-k dielectrics, flowable oxides, porous dielectrics, or organic dielectrics including porous organic dielectrics.

As known by those skilled in the art, after deposition of the first interlevel dielectric layer 810, a planarization process (e.g., CMP) can be conducted on the semiconductor structure 100. This process may expose a top surface of the sacrificial hardmask 130 in preparation for a replacement metal gate process, as will be described in detail below.

Figure 9:
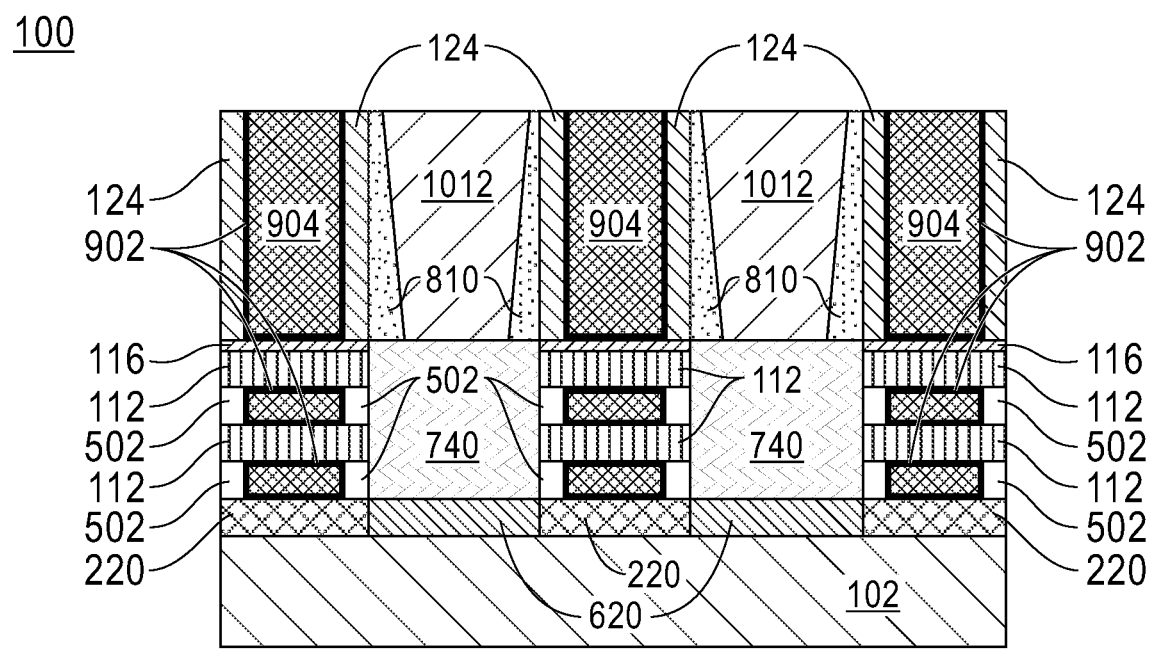
FIG. 9 is a cross-sectional view of the semiconductor structure after conducting a replacement metal gate process, according to an embodiment of the present disclosure.
Figure 10:
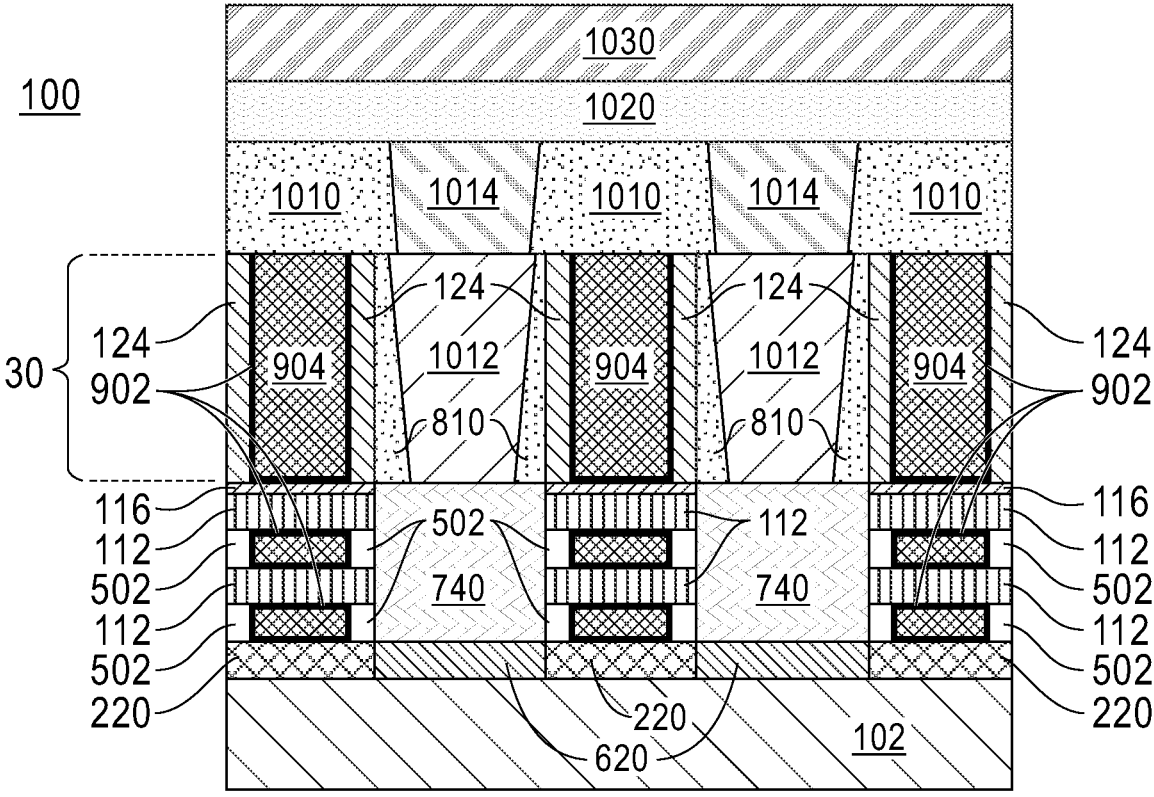
FIG. 10 is a cross-sectional view of the semiconductor structure after depositing a second interlevel dielectric layer, and forming metal contacts and conductive vias, according to an embodiment of the present disclosure.

Referring now to FIG. 9 and FIG. 10, simultaneously, cross-sectional views of the semiconductor structure 100 are shown after conducting a replacement metal gate process, depositing a second interlevel dielectric layer 1010, and forming metal contacts 1012 and conductive vias 1014, according to an embodiment of the present disclosure.

In the depicted embodiment, the dummy gate 120 (FIG. 8) is removed from the semiconductor structure 100. As known in the art, in a gate-last fabrication process, the removed dummy gate 120 (FIG. 8) is thereafter replaced with a high-k metal gate structure, i.e., gate dielectric stack 902 and replacement gate 904.

According to an embodiment, the second sacrificial semiconductor layers 110 (FIG. 8) can now be removed from the semiconductor structure 100 using known etching processes including, for example, RIE, wet etch or dry gas (HCl). Removal of the sacrificial semiconductor layers 110 (FIG. 8) create cavities (not shown) between the inner spacers 502 that will subsequently be filled with corresponding gate dielectric and work function metals to form the high-k metal gate structure, as depicted in FIG. 9.

The gate dielectric stack 902 is formed within the cavities (not shown) formed between the inner spacers 502 after removal of the sacrificial semiconductor layers 106 and within openings (not shown) remaining between sidewall spacers 124 after removal of the dummy gate 120 (FIG. 8). In some embodiments, the gate dielectric stack 902 includes a layer of silicon oxide and a layer of a high-k dielectric material, such as a hafnium based material. The replacement gate 904 is deposited above the gate dielectric stack 902 to complete formation of the high-k metal gate structure. The replacement gate 904 may include one or more work function metals such as, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). As can be appreciated in FIG. 9, the replacement gate 904 surrounds (stacked) semiconductor channel layers 108. In some embodiments, a gate cap (not depicted in the figures) can be formed above the replacement gate 904.

After forming the gate dielectric stack 902 and replacement gate 904, a chemical mechanical polishing (CMP) may be conducted to remove excess material and polish upper surfaces of the semiconductor structure 100.

With reference now to FIG. 10, a plurality of conductive structures including metal contacts 1012 and conductive vias 1014 are formed in the semiconductor structure 100 for electrically connecting front-end-of-line level (FEOL) devices to subsequently formed metal levels. The process of forming the metal contacts 1012 and conductive vias 1014 is standard and well-known in the art. Typically, the process includes forming trenches (not shown) within a third inter-level dielectric layer 1010 and subsequently filling the trenches with a conductive material or a combination of conductive materials to form the metal contacts 1012 and conductive vias 1014. In one or more embodiments, the conductive material filling the metal contacts 1012 and conductive vias 1014 may include a silicide liner (e.g., titanium (Ti), nickel (Ni), nickel-platinum (NiPt) alloy, etc.), a metal adhesion liner (e.g., titanium nitride (TiN)), and a conductive metal (e.g., aluminum (Al), tungsten (W), copper (Co), ruthenium (Ru), or any combination thereof).

The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100. Specifically, in the depicted example, metal contacts 1012 may include source/drain contacts (CA) that extend until an uppermost surface of source/drain regions 740, as depicted in FIG. 10, and gate contacts (CB) to the replacement gate 904 (not depicted in the figures).

In one or more embodiments, a BEOL interconnect level 1020 can be formed above, and electrically connected to, FEOL device level 30 of the semiconductor structure 100. Although not depicted in the figures, the BEOL interconnect level 1020 typically includes contacts, insulating layers (dielectrics), metal levels, and bonding sites for chip-to-package connections, as may be known by those skilled in the art. As mentioned above, various steps in the manufacture of semiconductor devices and semiconductor-based ICs are well known and so, in the interest of brevity, many conventional steps will only be mentioned briefly herein or will be omitted entirely without providing the well-known process details.

According to an embodiment, after forming the BEOL interconnect level 1020, the semiconductor structure 100 (i.e., the semiconductor wafer) is bonded to the carrier wafer (or auxiliary substrate) 1030. The carrier wafer 1030 may act as a reinforcing substrate for providing mechanical strength during processing (e g., thinning) of the semiconductor wafer. The process of bonding the semiconductor wafer to the carrier wafer 1030 can be achieved by conventional wafer bonding process, such as dielectric-to-dielectric bonding or Cu-to-Cu bonding.

Accordingly, the carrier wafer 1030 may include silicon oxide layers or SiCN layers, or any other layers applicable in the direct bonding technology applied in state of the art packaging techniques. Bonding of the device wafer to the carrier wafer 1030 takes place by such known direct bonding techniques, thus obtaining the assembly shown in FIG. 10. After bonding of the device wafer to the carrier wafer 1030 the wafer is flipped, as depicted in FIG. 11.

Figure 11:
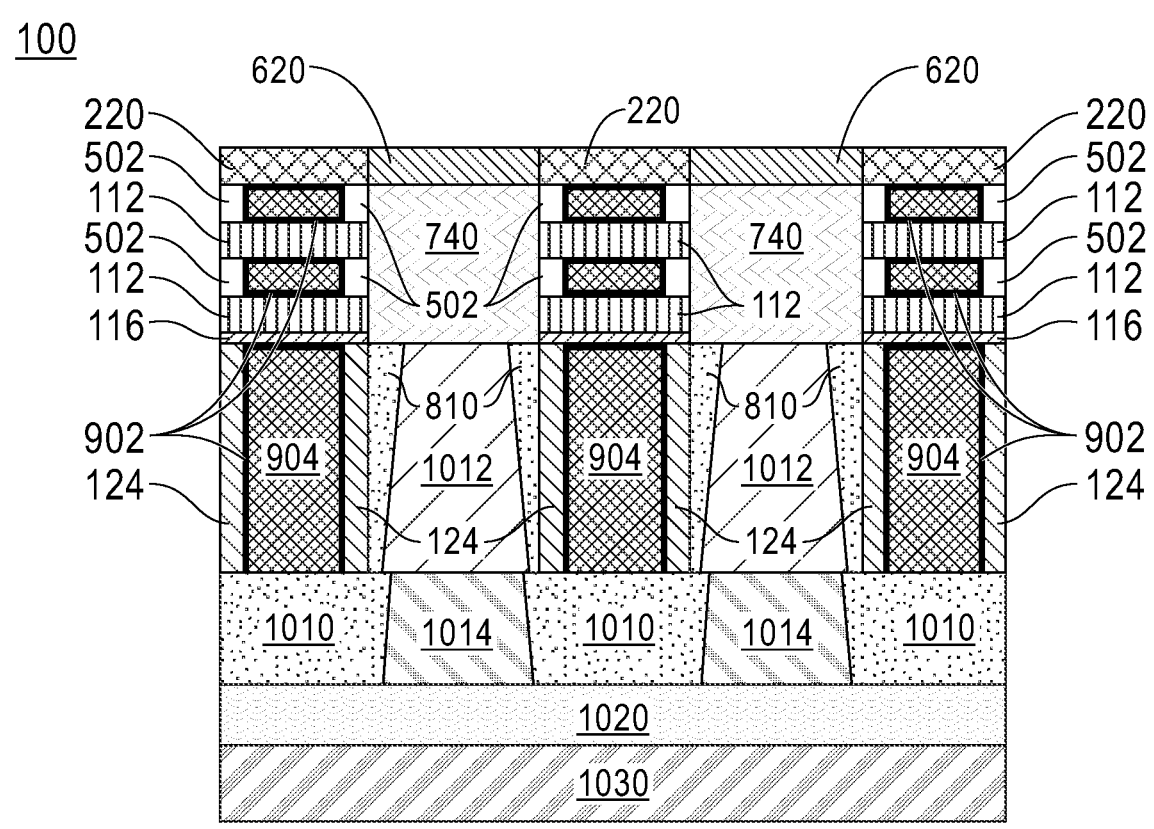
FIG. 11 is a cross-sectional view of the semiconductor structure after wafer flipping and substrate removal, according to an embodiment of the present disclosure.

Referring now to FIG. 11, a cross-sectional view of the semiconductor structure 100 is shown after wafer flipping and removing substrate 102, according to an embodiment of the present disclosure.

In the depicted embodiment, after the wafer is flipped, the substrate 102 (FIG. 10) can be removed using regular grinding, CMP and selective etching processes including wet or dry etching techniques. In one or more embodiments, the grinding process is conducted until substantially removing the substrate 102 from the semiconductor structure 100 and only a few microns of Si remains. After that, an optional CMP process can be further used to reduce the thickness variation, and finally a highly selective Si etching process is used to remove the remaining substrate 102 from the semi-conductor structure 100. In the depicted embodiment, the bottom dielectric isolation layer 220 and the second dielectric layer 620 form an etch stop layer during the highly selective Si removal process, preventing excessive Si etch which may damage the replacement gate 904 and source/drain regions 740.

Figure 12:
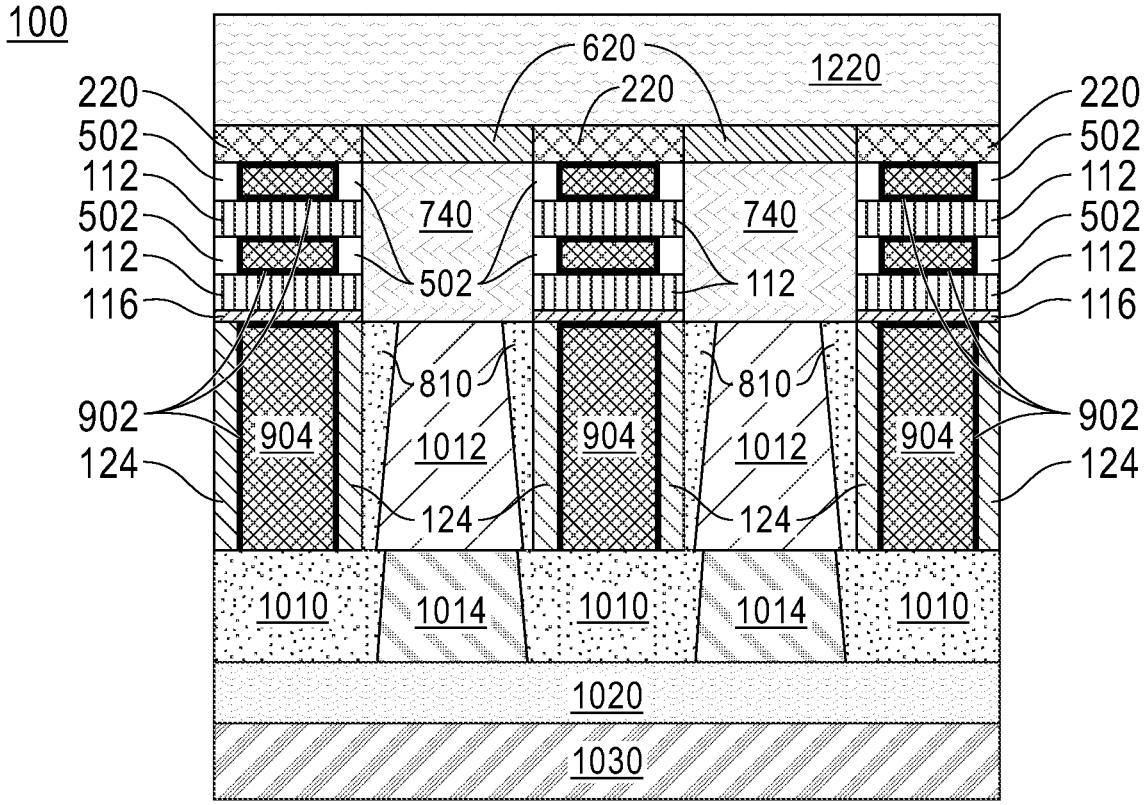
FIG. 12 is a cross-sectional view of the semiconductor structure after forming a backside interlayer dielectric, according to an embodiment of the present disclosure.
Figure 13:
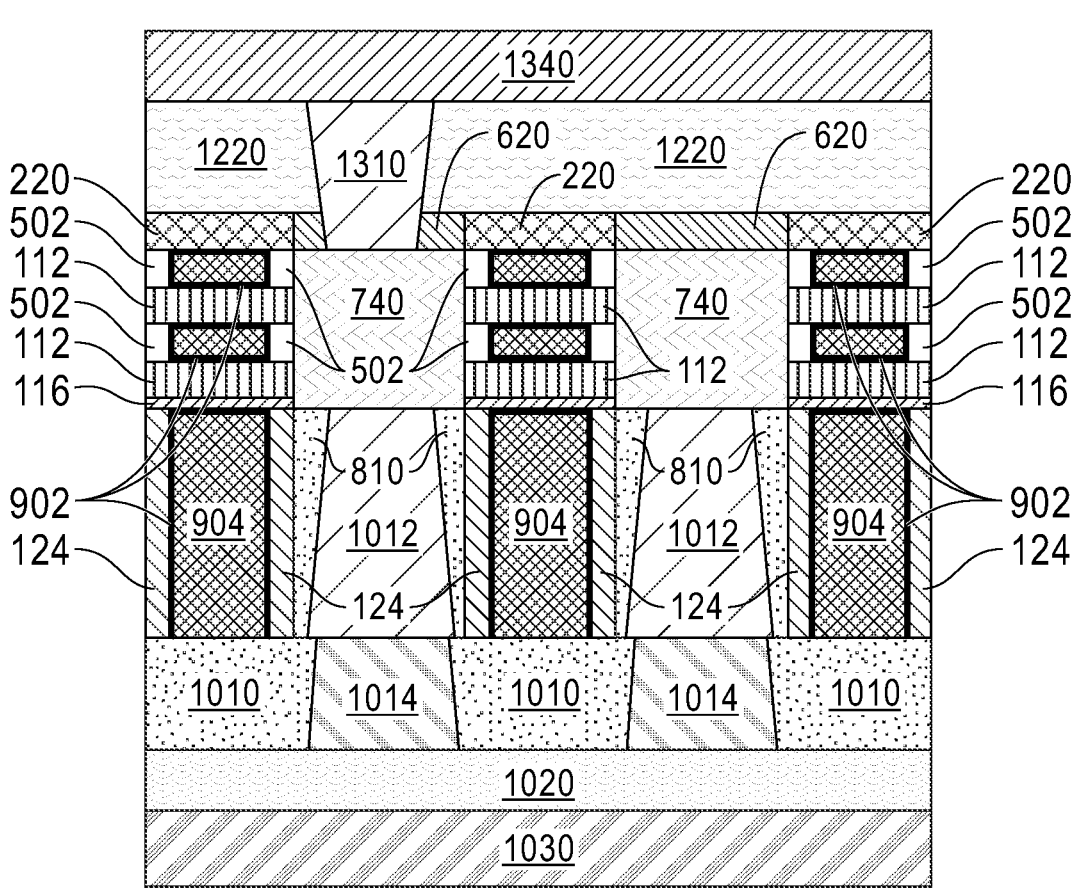
FIG. 13 is a cross-sectional view of the semiconductor structure after forming a backside metal contact structure and forming a backside interconnect layer or backside metallization layer, according to an embodiment of the present disclosure.

Referring now to FIG. 12 and FIG. 13 simultaneously, cross-sectional views of the semiconductor structure 100 are shown after forming a backside interlayer dielectric (BILD) 1220, forming a backside metal contact 1310, and forming a backside interconnect structure (or backside metallization layer) 1340, according to an embodiment of the present disclosure.

According to an embodiment, the BILD 1220 is formed using standard methods and materials, such as those used to form the first interlevel dielectric layer 810 described above with reference to FIG. 7. As depicted in FIG. 12, the BILD 1220 is disposed above the bottom dielectric isolation layer 220 and the second dielectric layer 620. In an exemplary embodiment, a thickness of the BILD 1220 may vary between approximately 420 nm to approximately 300 nm, and ranges therebetween. In one or more embodiments, a planarization process (e.g., CMP) can be conducted on the semiconductor structure 100 after forming the BILD 1220.

With reference now to FIG. 13, backside metal contact(s) 1310 may be formed using similar conductive materials and analogous deposition processes as those used to form the metal contacts 1012. In some embodiments, conductive metals for forming the backside metal contact 1310 may be selected according to subsequently formed backside power rail structures. In such instances the backside metal contact 1310 may be formed by depositing, for example, a silicide liner such as Ti, Ni, NiPt, an adhesion metal liner such as TiN, and a layer of low resistance metal, such as Ru, Co, W or Cu.

Although not depicted in the figures, in one or more embodiments, backside metal contact(s) 1310 can be formed between neighboring source/drain regions 740 located within NFET (i.e., N2N space) regions or PFET (i.e., P2P space) regions of the semiconductor structure 100. In the depicted embodiment, backside metal contact 1310 is formed in direct contact with a first surface or top surface of at least one source/drain region 740.

In one or more embodiments, the backside interconnect structure 1340 can be formed above and in contact with the backside metal contacts 1310 and BILD 1220. It should be noted that for ease of illustration, without intent of limitation, the backside interconnect structure 1340 is simplistically depicted as a single-layer region. However, those skilled in the art may understand that the simplistically depicted backside interconnect structure 1340 may be composed of a plurality of interconnect structures including, for example, backside power rails (BPRs) and backside power delivery network (BSPDN) made according to known techniques. Depending on the exact function of the transistor arrangement, a number of the source/drain regions 740 may be connected to backside power and ground via the backside metal contacts 1310.

It should be noted that the BEOL interconnect level 1020 in the semiconductor structure 100 manufactured according to the disclosed technology is separated from the backside interconnect structure 1340, thereby increasing the routing resources in the semiconductor structure 100 for signal wirings in the BEOL interconnect level 1020.

Accordingly, embodiments of the present disclosure provide a semiconductor structure, and a method of making the same, having an etch stop layer formed by the second dielectric layer 620 and the bottom dielectric isolation layer 220 that protects different areas of the semiconductor structure 100 during substrate removal. Additionally, in the described embodiments, the high etch selectivity of the second dielectric layer 620 with respect to the bottom dielectric isolation layer 220 allows forming self-aligned backside metal contacts 1310. In one or more embodiments, the high etch selectivity of the second dielectric 620 with respect to the bottom dielectric isolation layer 220 may also facilitate forming self-aligned back side metal contacts 1310 with controlled overlay shift for improving Vmax and forming self-aligned back side metal contacts 1310 with increased contact area for reducing contact resistance (Rc).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising: a field effect transistor including a plurality of source/drain regions and a metal gate structure; a dielectric layer in contact with a first surface of each of the plurality of source/drain regions; a bottom dielectric isolation layer in contact with a first surface of the metal gate structure, the bottom dielectric isolation layer being coplanar with the dielectric layer; and a backside metal contact extending through a backside interlevel dielectric and the dielectric layer to an uppermost surface of at least one source/drain region of the plurality of source/drain regions, the backside interlevel dielectric being disposed above the dielectric layer and above the bottom dielectric isolation layer, wherein the backside metal contact electrically connects the at least one source/drain region to a backside interconnect structure disposed above the backside interlevel dielectric; wherein the dielectric layer comprises a first dielectric material, wherein the bottom dielectric isolation layer comprises a second dielectric material, wherein an etch rate of the first dielectric material is different from an etch rate of the second dielectric material.

2. The semiconductor structure of claim 1, wherein the bottom dielectric isolation layer and the dielectric layer comprises an etch stop layer.

3. The semiconductor structure of claim 1, wherein the dielectric layer comprises a source/drain isolation region of rectangular shape.

4. The semiconductor structure of claim 1, wherein the first dielectric material has high etch selectivity with respect to the second dielectric material.

5. The semiconductor structure of claim 1, further comprising:

a metal contact in contact with a second surface of each of the plurality of source/drain regions, the second surface opposing the first surface of the plurality of source/drain regions.

6. The semiconductor structure of claim 1, further comprising:

a front-end-of-line level including the field effect transistor, the front-end-of-line level being electrically connected to a back-end-of-line interconnect level located on a first side of the front-end-of-line level.

7. The semiconductor structure of claim 6, further comprising:

a carrier wafer in contact with a surface of the back-end-of-line interconnect level opposing the plurality of source/drain regions and the metal contact.

8. The semiconductor structure of claim 1, wherein the field effect transistor includes at least one of a P-field effect transistor and an N-field effect transistor, and wherein the field effect transistor includes a nanosheet field effect transistor.

9. A method comprising: forming a field effect transistor including a plurality of source/drain regions and a metal gate structure; forming a dielectric layer in contact with a first surface of each of the plurality of source/drain regions; forming a bottom dielectric isolation layer in contact with a first surface of the metal gate structure, the bottom dielectric isolation layer being coplanar with the dielectric layer; and forming a backside metal contact, the backside metal contact extending through a backside interlevel dielectric and the dielectric layer until an uppermost surface of at least one source/drain region of the plurality of source/drain regions, the backside interlevel dielectric being disposed above the dielectric layer and above the bottom dielectric isolation layer, wherein the backside metal contact electrically connects the at least one source/drain region to a backside interconnect structure disposed above the backside interlevel dielectric; wherein the dielectric layer comprises a first dielectric material, wherein the bottom dielectric isolation layer comprises a second dielectric material, wherein an etch rate of the first dielectric material is different from an etch rate of the second dielectric material.

10. The method of claim 9, wherein the bottom dielectric isolation layer and the dielectric layer comprises an etch stop layer.

11. The method of claim 9, wherein the dielectric layer comprises a source/drain isolation region of rectangular shape.

12. The method of claim 9, wherein the first dielectric material has high etch selectivity with respect to the second dielectric material.

13. The method of claim 9, further comprising:

forming a metal contact in contact with a second surface of each of the plurality of source/drain regions, the second surface opposing the first surface of the plurality of source/drain regions.

14. The method of claim 9, further comprising:

forming a front-end-of-line level including the field effect transistor, the front-end-of-line level being electrically connected to a back-end-of-line interconnect level located on a first side of the front-end-of-line level.

15. The method of claim 14, further comprising:

forming a carrier wafer in contact with a surface of the back-end-of-line interconnect level opposing the plurality of source/drain regions and the metal contact.

16. The method of claim 9, wherein the field effect transistor includes at least one of a P-field effect transistor and an N-field effect transistor, and wherein the field effect transistor includes a nanosheet field effect transistor.

* * * * *